United States Patent …

(12) United States Patent
Müllauer

(10) Patent No.: US 7,102,443 B2
(45) Date of Patent: Sep. 5, 2006

(54) TEMPERATURE-STABILIZED AMPLIFIER CIRCUIT

(75) Inventor: Markus Müllauer, Friesach (AT)

(73) Assignee: Infineon Technologies AG, Munich (DE)

( * ) Notice: Subject to any disclaimer, the term of this patent is extended or adjusted under 35 U.S.C. 154(b) by 89 days.

(21) Appl. No.: 10/490,260

(22) PCT Filed: Jul. 23, 2002

(86) PCT No.: PCT/DE02/02707

§ 371 (c)(1),
(2), (4) Date: Oct. 25, 2004

(87) PCT Pub. No.: WO03/028207

PCT Pub. Date: Apr. 3, 2003

(65) Prior Publication Data

US 2005/0052243 A1   Mar. 10, 2005

(30) Foreign Application Priority Data

Sep. 25, 2001   (DE) ................. 101 47 101

(51) Int. Cl.
*H03F 3/04* (2006.01)
(52) U.S. Cl. ................ 330/289; 330/254; 330/301; 330/295
(58) Field of Classification Search ............. 330/289, 330/254, 301, 295
See application file for complete search history.

(56) References Cited

U.S. PATENT DOCUMENTS

| 4,159,450 A | * | 6/1979 | Hoover ................. 330/264 |
|---|---|---|---|
| 4,636,742 A | | 1/1987 | Oritani |
| 5,394,112 A | * | 2/1995 | Alini et al. ............. 330/256 |
| 5,739,681 A | * | 4/1998 | Allman ................. 323/314 |
| 5,801,584 A | | 9/1998 | Mori |
| 5,805,401 A | * | 9/1998 | Schuellein et al. ....... 361/92 |
| 5,812,024 A | * | 9/1998 | Mastrocola ............. 330/9 |
| 6,107,887 A | | 8/2000 | Zucker et al. |
| 6,693,467 B1 | * | 2/2004 | Marie ................... 327/103 |

FOREIGN PATENT DOCUMENTS

EP   0 961 409 A1   12/1999

OTHER PUBLICATIONS

"Temperaturkompensation bei Mβgrößen". (Temperature compensation of Measured Quantities), Elektronik, 1981, Heft 5, pp. 121-122 and 2 pages of translation.

* cited by examiner

*Primary Examiner*—Patricia Nguyen
(74) *Attorney, Agent, or Firm*—Eschweiller & Associates, LLC

(57) ABSTRACT

A circuit for amplifying an input voltage (VIN) into an output voltage (VOUT) with an overall gain factor, which is a product of a first gain factor (S) and a second gain factor (R1), comprises means for generating an intermediate signal (I2) from the input voltage (VIN) and the first gain factor (S) and means for generating the output voltage (VOUT) from the intermediate signal (I2) and the second gain factor (R1). The first gain factor (S) and the second gain factor (R1) have opposite temperature dependencies.

12 Claims, 1 Drawing Sheet

TEMPERATURE-STABILIZED AMPLIFIER CIRCUIT

RELATED APPLICATION

This application is a National Stage filing of International Application No. PCT/DE02/02707 filed Jul. 23, 2002, which is entitled "Temperature-Stabilized Amplifier Circuit", which was not published in English, that claims priority to German Patent Application No. 101 47 101.7 filed on Sep. 25, 2001, and both are hereby incorporated by reference in their entirety.

FIELD OF THE INVENTION

The invention relates to a circuit for amplifying an input voltage into an output voltage with a temperature-stabilized gain factor.

BACKGROUND OF THE INVENTION

Amplifier circuits often have the problem that they contain temperature-dependent components, the consequence of which is that the output signals of the amplifier circuit are likewise a function of the operating temperature.

FIG. 1 shows a schematic circuit diagram of an amplifier circuit based on CMOS (Complementary Metal Oxide Semiconductor) technology. The amplifier circuit contains a transconductance amplifier OTA, which converts an input voltage VIN into a current I2. The current I2 is converted into an output voltage VOUT by an operational amplifier OPA, which is connected up with a resistor R1 as a current-voltage converter CVC.

In addition to high-impedance inputs 1 and 2, the transconductance amplifier OTA also has a high-impedance output 3. The transconductance amplifier OTA therefore behaves like a current source so that the current I2 that can be coupled out at the output 3 is controlled by the input voltage VIN in accordance with the following equation (1):

$$I2 = S * VIN, \quad (1)$$

where S denotes the transconductance of the transconductance amplifier OTA and is given by the differential of the current I2 with respect to the input voltage VIN at the operating point.

Within the transconductance amplifier OTA, the latter has a differential amplifier stage comprising a current source IREF and also transistors T1 and T2. The input voltage VIN is present at the gate terminals of the transistors T1 and T2. Furthermore, the transconductance amplifier OTA comprises three current mirrors constructed with transistors T3 and T4, T5 and T6, and T7 and T8. The transistors T1, T2, T7 and T8 are n-channel MOSFETs, while the transistors T3, T4, T5 and T6 are p-channel MOSFETs.

The current I2 is converted into the output voltage VOUT by the operational amplifier OPA by means of the resistor R1 in accordance with the following equation (2):

$$VOUT = R1 * I2 + VCM, \quad (2)$$

where VCM specifies the center voltage. A combination of equations (1) and (2) yields equation (3) as the transfer function of the present amplifier circuit:

$$VOUT = S * R1 * VIN + VCM, \quad (3)$$

where the product of the transconductance S and the resistance R1 specifies the gain factor of the amplifier circuit.

In CMOS fabrication processes, linear resistors are often produced by deposition of polysilicon material. The temperature coefficient of such resistors which specifies the change in resistance with temperature, is correlated with the resistance per unit area of the polysilicon. In the case of only small resistances per unit area, the temperature coefficient is positive. The temperature coefficient decreases as the resistance per unit area rises and becomes negative for large resistances per unit area.

In the case of the present amplifier circuit, the resistor R1 must have a high resistance. Otherwise, the transconductance S of the transconductance amplifier OTA would have to be large in order nonetheless to obtain an acceptable gain factor of the amplifier circuit. However, this would in turn entail an unacceptably large current consumption of the transconductance amplifier OTA.

A high-value resistor R1 is fabricated by means of polysilicon with a high resistance per unit area in CMOS technology in order to avoid an excessively large area consumption. What is disadvantageous about this, however, is the resulting negative temperature coefficient of the resistor R1. Since the transconductance S of the transconductance amplifier OTA likewise decreases as the temperature rises the gain factor of the present amplifier circuit is greatly temperature-dependent. This property of the amplifier circuit is particularly disadvantageous if the amplifier circuit is operated in a wide temperature range. Moreover, fabrication tolerances of the high-value resistor R1 also influence the gain factor.

The present amplifier circuit is also utilized to amplify AC voltages. The open-circuit frequency of the amplifier circuit likewise depends on the gain factor. In the case of a gain factor that is unstable over a certain temperature range, this leads to stability problems in the amplifier circuit.

Previous solutions to the abovementioned problems comprise the use of a resistor R1 with only a small temperature coefficient and low fabrication tolerances and also the use of a temperature-independent current source IREF, thus resulting in only a low temperature-dependent transconductance S of the transconductance amplifier OTA. Although the temperature dependence of the gain factor is minimized by this solution approach, the area of the circuit becomes large because it is necessary to use polysilicon resistors with a low resistivity, or else it is necessary to produce temperature-stable high-value resistors by means of additional process steps. Both measures are complicated and cost-intensive.

In a further solution approach, in contrast to the solution approach just described, the temperature independence of the current source IREF is dispensed with and only a resistor R1 with a small temperature coefficient and low fabrication tolerances is used. However, the amplifier circuit is permitted to be operated only in a relatively small temperature range in this case.

SUMMARY OF THE INVENTION

Therefore, it is an object of the invention to provide an amplifier circuit which has a temperature-stabilized gain factor over a wide temperature range. In particular, the temperature stability of the gain factor is intended to be ensured also when using high-value resistors with large temperature coefficients.

By means of the amplifier circuit according to the invention, an input voltage is converted into an output voltage by means of an overall gain factor. The overall gain factor is a product of a first gain factor and a second gain factor. The amplifier circuit comprises first means, which serve for generating an intermediate signal in the form of an intermediate current from the input voltage and the first gain factor. Furthermore, the amplifier circuit comprises second means, which generate the output voltage from the intermediate signal and the second gain factor.

The first means comprise a current source and a transconductance amplifier, at whose input the input voltage is present and at whose output the intermediate current can be coupled out. The transconductance amplifier comprises a signal-amplifying MOS transistor which is operated below the threshold voltage and is fed from the current source via the source terminal. In this case, the current provided by the current source and, dependent thereon, also the first gain factor have an opposite temperature dependence with respect to the second gain factor.

The advantage of the amplifier circuit according to the invention is based on the opposite temperature dependencies of the first and second gain factors. In the event of a change in temperature, one of the two gain factors rises and the other gain factor falls, thus resulting overall in an essentially temperature-independent product of the two gain factors and, consequently, a temperature-stabilized overall gain factor.

Consequently, the amplifier circuit according to the invention achieves a compensation of the temperature dependencies of the two gain factors, thus resulting in a temperature independence of the overall gain factor over a wide temperature range. Furthermore, a temperature-dependent variation of the transfer frequency is suppressed by the amplifier circuit according to the invention.

In the case of the amplifier circuit according to the invention, the compensation effect results in particular by virtue of the fact that the signal-amplifying MOS transistor of the transconductance amplifier is operated below the threshold voltage. Only then is the transconductance S of the transconductance amplifier proportional to the current of the current source. This means that the temperature dependence of the current provided by the current source is transferred directly to the temperature dependence of the transconductance of the transconductance amplifier, thus resulting in a temperature-stabilized overall gain factor in accordance with equation (3).

If the first and second means, for generating the gain factors, have high-value resistors with large temperature coefficients, a temperature-independent overall gain factor nonetheless results on account of the compensation according to the invention of the temperature dependencies of the two gain factors.

In accordance with an advantageous refinement of the invention, the second means contain a current-voltage converter having an operational amplifier and a converter resistor connected into the feedback path of the operational amplifier. The current-voltage converter serves for converting the intermediate current generated by the transconductance amplifier into the output voltage.

A particularly advantageous refinement of the invention is characterized in that the current provided by the current source and the converter resistor have opposite temperature dependencies. The temperature dependence of the current provided by the current source is transferred to the temperature dependence of the transconductance of the transconductance amplifier. In accordance with equation (3) a temperature-stabilized overall gain factor of the amplifier circuit results from the abovementioned requirement.

For the circuitry realization of a current source whose current has an opposite temperature behavior to that of the converter resistor, it is particularly advantageous if the current source comprises a current source bank to whose input transistor a temperature-stabilized input current is fed and which has at least two output transistors connected in parallel. The output currents generated by the drain-source paths of the output transistors flow through at least one resistor and jointly feed the differential amplifier of the transconductance amplifier.

By virtue of the at least two output transistors being connected in parallel, the gate-source voltage of the at least two output transistors is lower than the gate-source voltage of the input transistor. The voltage difference generated on account of the different gate-source voltages is dropped across the at least one resistor. In this case, the larger the number of output transistors connected in parallel, the larger the voltage dropped across the at least one resistor.

The temperature dependence of the current which is generated by the drain-source paths of the at least two output transistors and feeds the differential amplifier of the transconductance amplifier is determined by the temperature dependence of the at least one resistor, to be precise the temperature dependence of said current behaves oppositely to the temperature dependence of the at least one resistor. As a result, the temperature dependence of the intermediate current also behaves oppositely to the at least one resistor and thus likewise oppositely to the converter resistor, which results in a temperature-stabilized overall gain factor.

If the input transistor and the at least two output transistors are coordinated well with one another, voltage variations caused by fabrication tolerances are thereby eliminated as well.

A temperature-stabilized input current can be generated particularly simply for example by a BGR (Band Gap Reference) circuit. Such circuits are already present in many devices and may advantageously also be used for the amplifier circuit according to the invention.

The amplifier circuit according to the invention is particularly suitable for being integrated on a common substrate and being fabricated in particular by means of CMOS technology. In such a fabrication process, both the converter resistor and the at least one resistor of the current source can be produced by deposition of polysilicon material with a high resistance per unit area. This ensures a low current consumption of the transconductance amplifier and a good temperature stability of the overall gain factor. Furthermore, in this case, the two linear resistors have comparable (negative) temperature coefficients and fabrication tolerances.

The method according to the invention serves for amplifying an input voltage into an output voltage. In this case, the overall gain factor, which specifies the amplification of the input voltage into the output voltage, is a product of a first and a second gain factor.

In the case of the method according to the invention, firstly an intermediate signal is generated in the form of an intermediate current from the input voltage and the first gain factor. This is done by means of a current source and a transconductance amplifier, at whose inputs the input voltage is present and at whose outputs an intermediate current can be coupled out. The current provided by the current source and, dependent thereon, also the first gain factor have opposite temperature dependencies with respect to the second gain factor. A MOS transistor of the transconductance amplifier which is fed from the current source via the source terminal is in this case operated below the threshold voltage. Afterward, the output voltage is generated from the intermediate signal and the second gain factor.

The advantage of the method according to the invention again resides in the opposite temperature dependencies of the first and the second gain factor. This compensation effect, as already described, is made possible by the MOS transistor being operated below the threshold voltage. This results overall in an overall gain factor which is stabilized over a wide operating temperature range.

BRIEF DESCRIPTION OF THE DRAWINGS

The invention is explained in more detail below with reference to the drawings, in which.

DETAILED DESCRIPTION OF THE INVENTION

Figure 1:
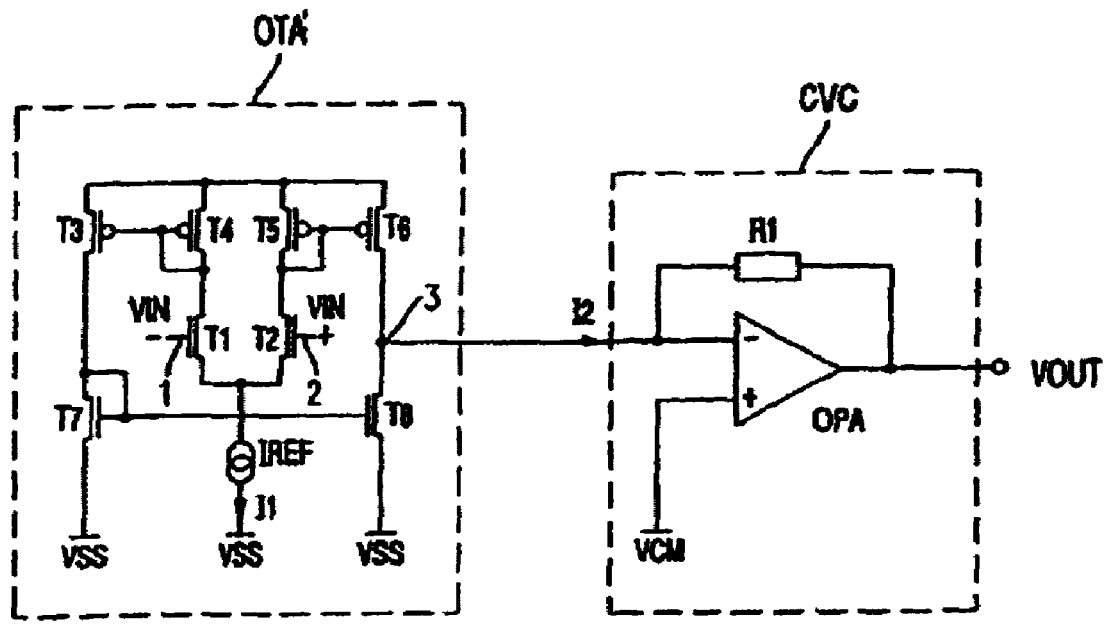
FIG. 1 shows a schematic circuit diagram of an amplifier circuit in accordance with the prior art.
Figure 2:
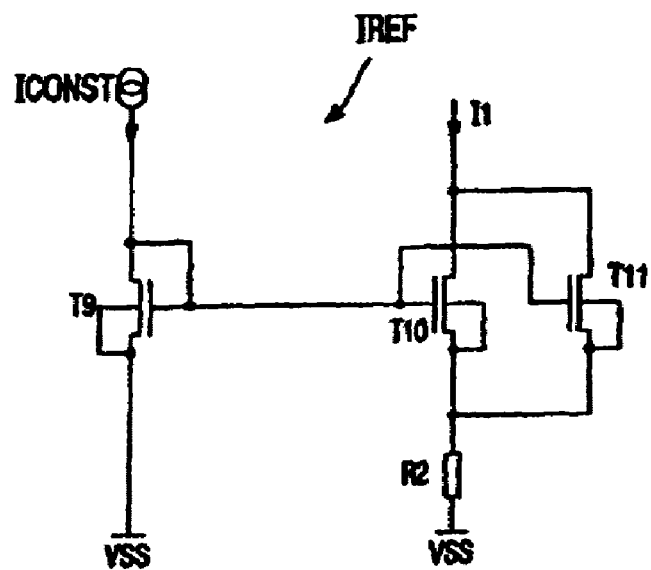
FIG. 2 shows a schematic circuit diagram of an exemplary embodiment of the current source according to the invention for feeding the differential amplifier of the transconductance amplifier shown in FIG. 1.

FIG. 2 shows a schematic circuit diagram of an exemplary embodiment of a current source IREF according to the invention, which serves for providing a current I1, which is used for the differential amplifier stage of the transconductance amplifier OTA as shown in FIG. 1. The current source IREF contains a transistor T9, the source-drain path of which is connected between a current source ICONST and a common fixed potential, in particular a ground VSS. The transistor T9 is connected as the input transistor of a current source bank to transistors T10 and T11 as output transistors via their gate terminals. Furthermore, the drain terminal of the transistor T9 is connected to its gate terminal. The transistors T10 and T11 are respectively connected to one another at their drain and source terminals. A resistor R2 is connected between the source terminals of the transistors T10 and T11 and the ground VSS. The current I1 is generated on the side of the drain terminals of the transistors T10 and T11. The transistors T9, T10 and T11 are n-channel MOSFETs, by way of example.

A precondition for the functioning according to the invention of the present circuit is that the current source ICONST provides a temperature-independent current. This precondition is met for example by a BGR circuit. The current generated by the current source ICONST is mirrored into the drain-source paths of the transistors T10 and T11 by the transistor T9.

In this case, the gate-source voltage of the transistor T9 is larger than the gate-source voltages of the transistors T10 and T11. The difference between these gate-source voltages is dropped across the resistor R2. The more transistors are connected in parallel like the transistors T10 and T11 as output transistors of the current source bank, the larger the voltage dropped across the resistor R2. The larger, too, the temperature dependence of the current I1 on the resistor R2, since the current I1 is a function of 1/R2.

Furthermore, the transconductance of a CMOS transistor is proportional to the current flowing through its drain-source path if the CMOS transistor is operated below the threshold voltage. Since the optimum operating point for the differential amplifier stage having the CMOS transistors T1 and T2 is situated between the subthreshold voltage range and the voltage range with slight inversion, the transconductance S of the transconductance amplifier OTA is likewise proportional to the current I1 and, in accordance with the paragraph above, is thus a function of 1/R2. It follows from this that the gain factor of the amplifier circuit as shown in FIG. 1 with the present current source IREF according to the invention is proportional to the resistor R1 and indirectly proportional to the resistor R2. Since the resistors R1 and R2 have identical temperature dependencies on account of their design, the gain factor is temperature-independent over a wide temperature range.

The invention claimed is:

1. An amplifier circuit with a temperature-stabilized overall gain factor, which specifies the amplification of an input voltage (VIN) into an output voltage (VOUT) and which is a product of a first gain factor (S) and a second gain factor (R1), the amplifier circuit comprising:

first means for generating an intermediate signal in the form of an intermediate current from the input voltage and the first gain factor further comprising:
a current source; and
a transconductance amplifier, at whose input the input voltage is present and at whose output the intermediate current is provided,
a signal-amplifying MOS transistor of the transconductance amplifier which is fed from the current source via a source terminal thereof being operated below a threshold voltage associated therewith, and second means for generating the output voltage from the intermediate signal and the second gain factor, wherein the current provided by the current source and, dependent thereon, also the first gain factor have opposite temperature dependencies with respect to the second gain factor.

2. The amplifier circuit as claimed in claim 1, wherein the current source feeds a differential amplifier of the transconductance amplifier.

3. The amplifier circuit as claimed in claim 1 wherein the second means comprises an operational amplifier, which is connected up with a converter resistor as a converter and converts the intermediate current into the output voltage.

4. The amplifier circuit as claimed in claim 3, wherein the current provided by the current source and the converter resistor have opposite temperature dependencies.

5. The amplifier circuit as claimed in one or more of claim 2, wherein the current source comprises a current source bank having an input transistor is fed with a temperature-stabilized input current, and which has at least two transistors connected in parallel as output transistors, the output currents generated by the drain-source paths of the output transistors flowing through at least one resistor and jointly feeding the differential amplifier of the transconductance amplifier.

6. The amplifier circuit as claimed in claim 1, wherein the first and the second means are integrated on a common substrate, and the amplifier circuit comprises a CMOS amplifier circuit.

7. The amplifier circuit as claimed in claim 6, wherein the converter resistor and the at least one resistor of the current source are integrated linear resistors which have a high temperature coefficient.

8. A method for amplifying an input voltage into an output voltage with a temperature-stabilized overall gain factor, which specifies the amplification of the input voltage into the output voltage and is a product of a first gain factor and a second gain factor, comprising:

generating an intermediate signal in the form of an intermediate current from the input voltage and the first gain factor by means of a current source and a transconductance amplifier, at whose inputs the input voltage is present and at whose output the intermediate current is provided, the current provided by the current source and, dependent thereon, also the first gain factor having opposite temperature dependencies with respect to the second gain factor, and a MOS transistor of the transconductance amplifier which is fed from the current source via the source terminal being operated below the threshold voltage; and generating the output voltage from the intermediate signal and the second gain factor.

9. An amplifier circuit, comprising:

a transconductance amplifier circuit operable to receive an input voltage and output an intermediate current based on the input voltage and a first gain factor, the transconductance amplifier further comprising:
- a current source circuit operable to generate a reference current; and
- a differential MOS input pair fed by the reference current, and biased to operate below a threshold voltage associated therewith; and a current-voltage converter circuit configured to output a voltage based on the intermediate current according to a second gain factor, wherein the reference current and first gain factor have a temperature coefficient of a first type, and the second gain factor has a temperature coefficient of a second, opposite type.

10. The amplifier circuit of claim 9, wherein the first type temperature coefficient is positive and the second type temperature coefficient is negative.

11. The amplifier circuit of claim 9, wherein the current-voltage converter comprises an operational amplifier circuit having a positive input coupled to predetermined potential, and a negative input coupled to an output of the transconductance amplifier circuit, and having a first resistor coupled between an output thereof and the negative input, wherein the first resistor contributes to the second gain factor.

12. The amplifier circuit of claim 9, wherein the current source of the transconductance amplifier circuit comprises:
- an input transistor fed with a substantially temperature independent input current; and
- a transistor bank comprising at least two transistors coupled together in parallel in a current mirror connection with the input transistor, and coupled between the differential MOS input pair and a second resistor.

* * * * *